United States Patent
Kojima et al.

(10) Patent No.: US 8,278,676 B2
(45) Date of Patent: Oct. 2, 2012

(54) SEMICONDUCTOR LIGHT-EMITTING DEVICE AND METHOD FOR MANUFACTURING SAME

(75) Inventors: Akihiro Kojima, Kanagawa-ken (JP); Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 12/728,837

(22) Filed: Mar. 22, 2010

(65) Prior Publication Data

US 2011/0114986 A1 May 19, 2011

(30) Foreign Application Priority Data

Nov. 19, 2009 (JP) ................... 2009-263639
Mar. 12, 2010 (JP) ................... 2010-055487

(51) Int. Cl.
*H01L 33/10* (2010.01)
*H01L 33/38* (2010.01)

(52) U.S. Cl. ............... 257/98; 257/99; 257/E33.005; 257/E33.025; 257/E33.028; 438/39; 438/46

(58) Field of Classification Search ........... 257/98, 257/99, E3.005, E33.025, E33.028, E33.005; 438/39, 46

See application file for complete search history.

(56) References Cited

U.S. PATENT DOCUMENTS

| | | | |
|---|---|---|---|
| 5,952,681 A * | 9/1999 | Chen | ............... 257/89 |
| 6,331,450 B1 | 12/2001 | Uemura | |
| 2010/0140640 A1 | 6/2010 | Shimokawa et al. | |
| 2010/0148198 A1 | 6/2010 | Sugizaki et al. | |
| 2011/0073889 A1 | 3/2011 | Sugizaki et al. | |
| 2011/0114978 A1 | 5/2011 | Kojima et al. | |

FOREIGN PATENT DOCUMENTS

| | | |
|---|---|---|
| JP | 10-163536 | 6/1998 |
| JP | 2000-244012 | 9/2000 |
| JP | 2005-116998 | 4/2005 |
| WO | 2006/068297 A1 | 6/2006 |
| WO | 2010/132139 A1 | 11/2010 |

OTHER PUBLICATIONS

Extended European Search Report for European Application No. 10157159.4 mailed on May 19, 2011.

* cited by examiner

*Primary Examiner* — Evan Pert
(74) *Attorney, Agent, or Firm* — Turocy & Watson, LLP (57) ABSTRACT

A semiconductor light-emitting device includes: a first semiconductor layer having a first major surface and a second major surface which is an opposite side to the first major surface; a second semiconductor layer provided on the second major surface of the first semiconductor layer and including a light-emitting layer; a first electrode provided on the second major surface of the first semiconductor layer; a second electrode provided on a surface of the second semiconductor layer, the surface being an opposite side to the first semiconductor layer; an insulating film provided on a side surface of the second semiconductor layer, and an edge of an interface between the first semiconductor layer and the second semiconductor layer; and a metal film provided on the insulating film from the second electrode side toward the edge of the interface.

20 Claims, 6 Drawing Sheets

SEMICONDUCTOR LIGHT-EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2009-263639, filed on Nov. 19, 2009 and the prior Japanese Patent Application No. 2010-055487, filed on Mar. 12, 2010; the entire contents of which are incorporated herein by reference.

BACKGROUND

A wavelength-converting light-emitting diode is conventionally known, in which a blue light-emitting element is combined with a phosphor layer to produce, for instance, white light. JP-A 2005-116998, for instance, discloses a manufacturing technique in which a phosphor layer is formed on the upper surface of a wafer including numerous LEDs, and then the wafer is cut into chip-size pieces.

SUMMARY

According to an aspect of the invention, there is provided a semiconductor light-emitting device including: a first semiconductor layer having a first major surface and a second major surface which is an opposite side to the first major surface; a second semiconductor layer provided on the second major surface of the first semiconductor layer and including a light-emitting layer; a first electrode provided on the second major surface of the first semiconductor layer; a second electrode provided on a surface of the second semiconductor layer, the surface being an opposite side to the first semiconductor layer; an insulating film provided on a side surface of the second semiconductor layer, and an edge of an interface between the first semiconductor layer and the second semiconductor layer; and a metal film provided on the insulating film from the second electrode side toward the edge of the interface.

According to an aspect of the invention, there is provided a semiconductor light-emitting device including: a first semiconductor layer having a first major surface and a second major surface which is an opposite side to the first major surface; a second semiconductor layer provided on the second major surface of the first semiconductor layer and including a light-emitting layer; a first electrode provided on the second major surface of the first semiconductor layer; a second electrode provided on a surface of the second semiconductor layer, the surface being an opposite side to the first semiconductor layer; an insulating film provided on a side surface of the second semiconductor layer including an edge of the light-emitting layer; and a metal film provided on the insulating film from the second electrode side toward the edge of the light-emitting layer.

According to an aspect of the invention, there is provided a method for manufacturing a semiconductor light-emitting device, including: forming a multilayer body including a first semiconductor layer having a first major surface and a second major surface which is an opposite side to the first major surface, a second semiconductor layer including a light-emitting layer laminated on the second major surface of the first semiconductor layer, a first electrode formed on the second major surface of the first semiconductor layer and a second electrode provided on a surface of the second semiconductor layer, the surface being an opposite side to the first semiconductor layer; forming an insulating film on a side surface of the second semiconductor layer, and an edge of an interface between the first semiconductor layer and the second semiconductor layer; and forming a metal film on the insulating film from the second electrode side toward the edge of the interface.

DETAILED DESCRIPTION

Embodiments of the invention will now be described with reference to the drawings.

Figure 1A:
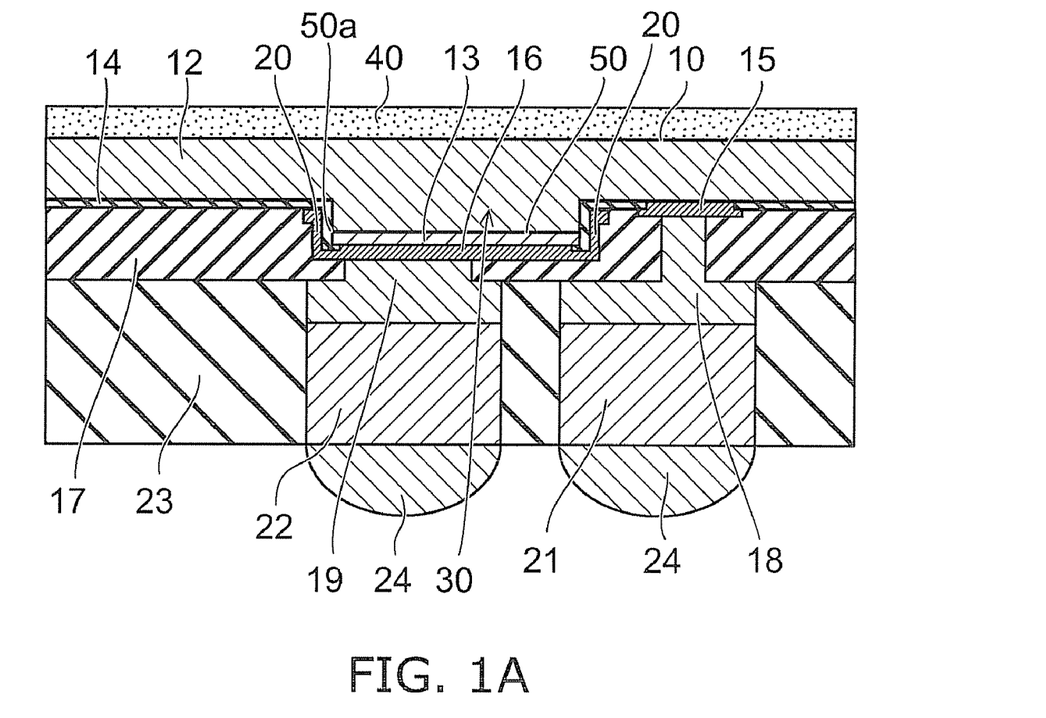
FIG. 1A is a schematic cross-sectional view of a semiconductor light-emitting device according to an embodiment.

FIG. 1A is a schematic cross-sectional view of a semiconductor light-emitting device according to an embodiment.

The semiconductor light-emitting device according to this embodiment includes a semiconductor structure section, a package structure section including an interconnect layer, and a phosphor layer, which are collectively formed in wafer state. The semiconductor structure section includes a first semiconductor layer 12 and a second semiconductor layer 13. The second semiconductor layer 13 has a structure in which a light-emitting layer (or active layer) is sandwiched between a p-type cladding layer and an n-type cladding layer. The first semiconductor layer 12 is illustratively of n-type and functions as a lateral current path. However, the conductivity type of the first semiconductor layer 12 is not limited to n-type, but may be p-type.

Figure 6:
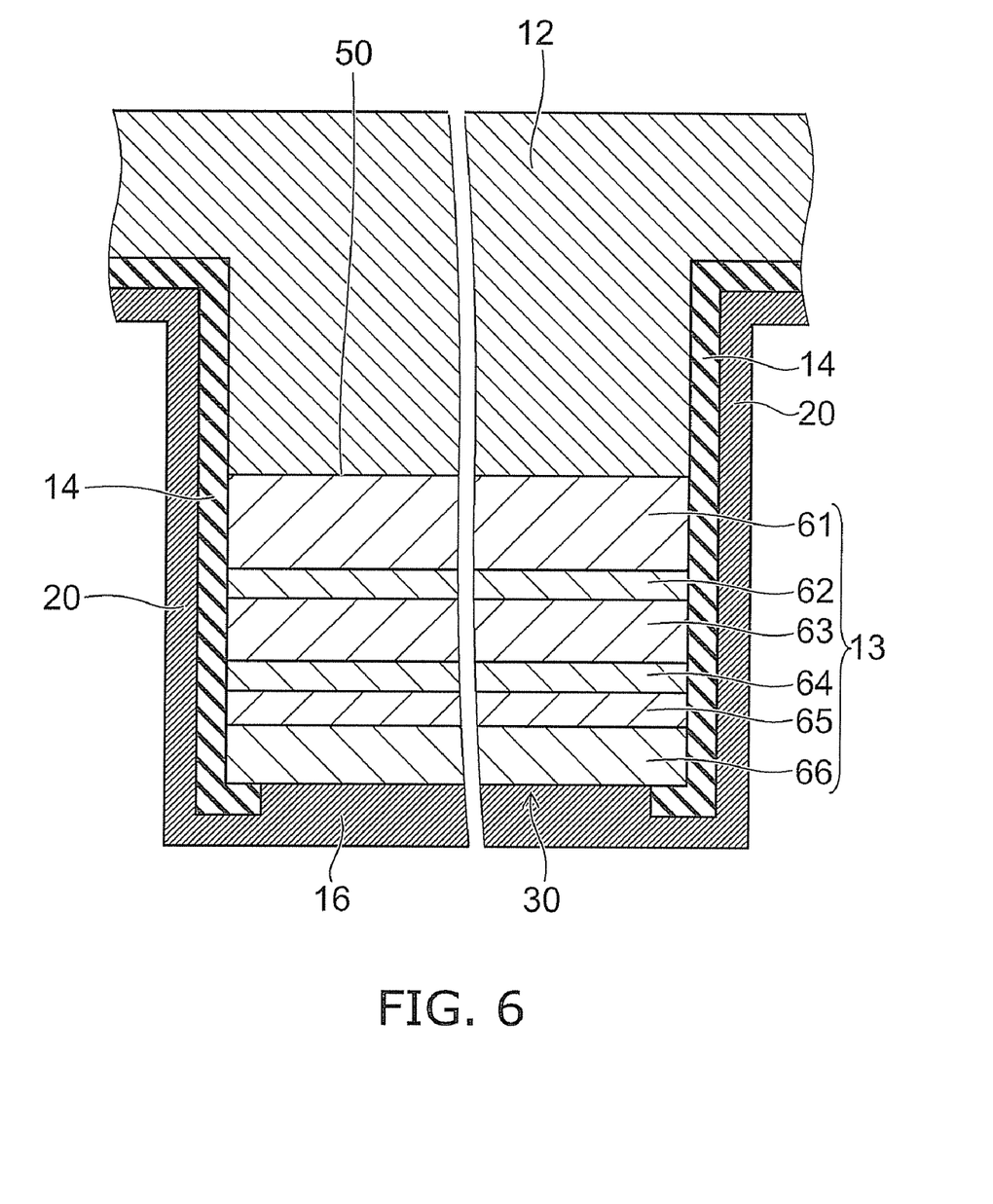
FIG. 6 is an enlarged view of a protrusion shown in FIG. 1.

For instance, as shown in FIG. 6, the second semiconductor layer 13 includes an n-type GaN layer 61, an n-type InGaN layer 62, a light-emitting layer 63, a p-type GaN layer 64, a p-type AlGaN layer 65 and a p-type GaN layer 66. For instance, the light-emitting layer 63 includes a multiple quantum well structure. For instance, the first semiconductor layer 12 is an n-type GaN layer. The n-type GaN layer 61, the n-type InGaN layer 62, the light-emitting layer 63, the p-type GaN layer 64, the p-type AlGaN layer 65 and the p-type GaN layer 66 are sequentially stacked on the second surface of the first semiconductor layer 12.

Light is extracted outside mainly from a top surface 10. The second semiconductor layer 13 is provided on the second major surface opposite to the top surface 10. Part of the second major surface side of the first semiconductor layer 12 is processed into a protruding shape, and the second semiconductor layer 13 is provided on the surface of that protrusion 30. The protrusion 30 is made of a multilayer body of the first semiconductor layer 12 and the second semiconductor layer 13, including the interface 50 between the first semiconductor layer 12 and the second semiconductor layer 13.

An n-side electrode 15 is provided on the portion of the second major surface of the first semiconductor layer 12 where the second semiconductor layer 13 is not provided. A p-side electrode 16 is provided on the surface of the second semiconductor layer 13 opposite to its surface in contact with the first semiconductor layer 12.

The portion of the second major surface and the second semiconductor layer 13 other than the portion where the n-side electrode 15 and the p-side electrode 16 are provided is covered with an insulating film 14. The insulating film 14 also covers the side surface of the protrusion 30 including the interface 50 between the first semiconductor layer 12 and the second semiconductor layer 13.

A metal film 20 is provided outside the portion of the insulating film 14 covering the side surface of the protrusion 30. The metal film 20 covers, via the insulating film 14, the side surface of the second semiconductor layer 13 and the side surface of the protrusion 30 including the edge 50a of the interface 50 between the first semiconductor layer 12 and the second semiconductor layer 13. That is, the metal film 20 covers, via the insulating film 14, an edge of the light-emitting layer 63. The metal film 20 is opaque to and blocks the light emitted by the light-emitting layer. Furthermore, the metal film 20 is reflective to the light emitted by the light-emitting layer.

For instance, the metal film 20 is formed simultaneously with formation of the p-side electrode 16 and provided integrally with the p-side electrode 16. The metal film 20 is formed on the insulating film 14 from the p-side electrode 16 side toward the edge 50a of the interface 50. The metal film 20 is not connected to the n-side electrode 15 and is insulated from the first semiconductor layer 12 by the insulating film 14. Hence, the p-side electrode 16 is not directly electrically connected to the first semiconductor layer 12.

Figure 1B:
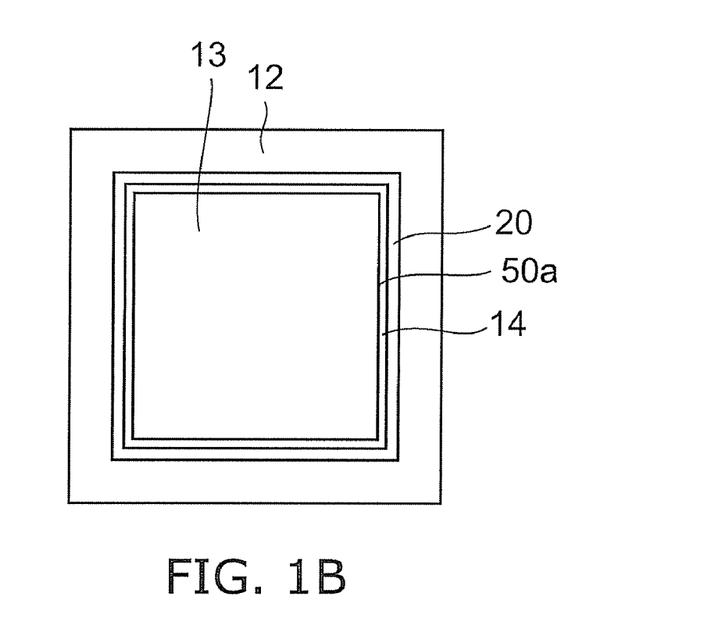
FIG. 1B is a schematic view showing a planar layout of components of the semiconductor light-emitting device.

FIG. 1B shows a planar layout of the first semiconductor layer 12, the second semiconductor layer 13, the insulating film 14 formed on the side surface of the protrusion 30, and the metal film 20.

The second semiconductor layer 13 is smaller in planar size than the first semiconductor layer 12. The insulating film 14 continuously covers, like a frame, the periphery of the side surface of the second semiconductor layer 13 and the side surface of the protrusion 30 including the edge 50a of the interface 50 between the first semiconductor layer 12 and the second semiconductor layer 13. The metal film 20 continuously covers, like a frame, via the insulating film 14, the periphery of the side surface of the second semiconductor layer 13 and the side surface of the protrusion 30 including the edge 50a of the interface 50 between the first semiconductor layer 12 and the second semiconductor layer 13.

Referring again to FIG. 1A, an insulating layer 17 is provided on the second major surface side so as to cover the insulating film 14, the n-side electrode 15, the p-side electrode 16, and the metal film 20. For instance, the insulating film 14 is made of silicon oxide, and the insulating layer 17 is made of silicon oxide or a resin such as polyimide. The n-side electrode 15 and the p-side electrode 16 are insulated from each other by the insulating film 14 and the insulating layer 17 and serve as electrically independent electrodes.

The surface of the insulating layer 17 opposite to its surface in contact with the n-side electrode 15 and the p-side electrode 16 is planarized, and an n-side interconnect 18 and a p-side interconnect 19 are provided on that surface. The n-side interconnect 18 is provided also in an opening, which is formed in the insulating layer 17 so as to reach the n-side electrode 15, and the n-side interconnect 18 is electrically connected to the n-side electrode 15. The p-side interconnect 19 is provided also in an opening, which is formed in the insulating layer 17 so as to reach the p-side electrode 16, and the p-side interconnect 19 is electrically connected to the p-side electrode 16. For instance, the n-side interconnect 18 and the p-side interconnect 19 are formed by electrolytic plating in which a seed metal formed on the surface of the insulating layer 17 including the inner wall surface of the opening is used as a current path.

The n-side electrode 15, the p-side electrode 16, the n-side interconnect 18, the p-side interconnect 19, the insulating film 14, and the insulating layer 17 are all provided on the opposite side of the semiconductor structure section from the top surface 10 and constitute the interconnect layer.

An n-side metal pillar 21 is provided below the n-side interconnect 18. A p-side metal pillar 22 is provided below the p-side interconnect 19. The periphery of the n-side metal pillar 21, the periphery of the p-side metal pillar 22, the n-side interconnect 18, and the p-side interconnect 19 are covered with a resin 23.

The first semiconductor layer 12 is electrically connected to the n-side metal pillar 21 through the n-side electrode 15 and the n-side interconnect 18. The second semiconductor layer 13 is electrically connected to the p-side metal pillar 22 through the p-side electrode 16 and the p-side interconnect 19. External terminals 24 such as solder balls and metal bumps are formed on the lower end surface of the n-side metal pillar 21 and the p-side metal pillar 22 exposed from the resin 23, and the semiconductor light-emitting device according to this embodiment can be electrically connected to external circuits through the external terminals 24.

In the structure of this embodiment, even if the semiconductor structure section (the multilayer body of the first semiconductor layer 12 and the second semiconductor layer 13) is thin, its mechanical strength can be maintained by thickening the n-side metal pillar 21, the p-side metal pillar 22, and the resin 23. Furthermore, the n-side metal pillar 21 and the p-side metal pillar 22 can absorb and relax the stress applied to the semiconductor layer through the external terminals 24 when the device is mounted on a circuit board or the like. Preferably, the resin 23 serving to support the n-side metal pillar 21 and the p-side metal pillar 22 has a thermal expansion coefficient, which is equal or close to that of the circuit board and the like. Examples of such a resin 23 include epoxy resin, silicone resin, and fluororesin.

The n-side interconnect 18, the p-side interconnect 19, the n-side metal pillar 21, and the p-side metal pillar 22 can be made of such a material as copper, gold, nickel, and silver. Among them, it is more preferable to use copper, which has good thermal conductivity, high migration resistance, and superior contact with the insulating film.

A phosphor layer 40 is provided on the top surface 10. The phosphor layer 40 has a generally uniform thickness throughout the top surface 10. The phosphor layer 40 can absorb the light from the light-emitting layer and emit wavelength-converted light. Thus, it is possible to emit mixed light of the light from the light-emitting layer and the wavelength-converted light of the phosphor layer 40. For instance, for a nitride light-emitting layer, a white color, incandescent color and the like can be obtained as a mixed color of blue light from the light-emitting layer and yellow light, for instance, which is the wavelength-converted light of a yellow phosphor layer 40.

As shown in FIG. 6, the light-emitting layer 63 is provided near the interface 50 between the first semiconductor layer 12 and the second semiconductor layer 13, and emits light by supply of current to the first semiconductor layer 12 and the second semiconductor layer 13 through the aforementioned metal pillars, interconnects, and electrodes. The light emitted from the light-emitting layer 63 travels in the first semiconductor layer 12, enters the phosphor layer 40 from the top surface 10, passes through the phosphor layer 40, and is emitted outside.

Most of the light travels from the light-emitting layer 63 provided near the interface 50 toward the top surface 10 thereabove, but part of the light is emitted also from the edge of the light-emitting layer 63. However, the light emitted from the edge of the light-emitting layer 63 travels toward the outer edge of the semiconductor light-emitting device, significantly deviating outward from the path of the light traveling upward, and is significantly different in the distance of passage in the phosphor layer 40 from the light traveling from the light-emitting layer 63 up to the top surface 10. Furthermore, the light emitted from the edge of the light-emitting layer 63 may fail to pass through the phosphor layer 40. This may cause variation in the chromaticity of the light extracted outside.

However, in this embodiment, the edge of the light-emitting layer 63 is covered with the metal film 20. Hence, the light emitted from the edge of the light-emitting layer 63 can be blocked. As a result, variation in chromaticity can be suppressed, and light with a desired chromaticity can be extracted outside.

Furthermore, the metal film 20 continuously covers the periphery of the edge of the light-emitting layer 63. Hence, variation in chromaticity can be suppressed throughout the circumference.

Furthermore, the metal film 20 is reflective to the light emitted by the light-emitting layer so that the light emitted from the edge of the light-emitting layer 63 can be reflected by the metal film 20 and directed to the top surface 10. This can suppress decrease in brightness.

Next, a method for manufacturing a semiconductor light-emitting device according to this embodiment is described with reference to FIGS. 2A to 4B.

Figure 2A:
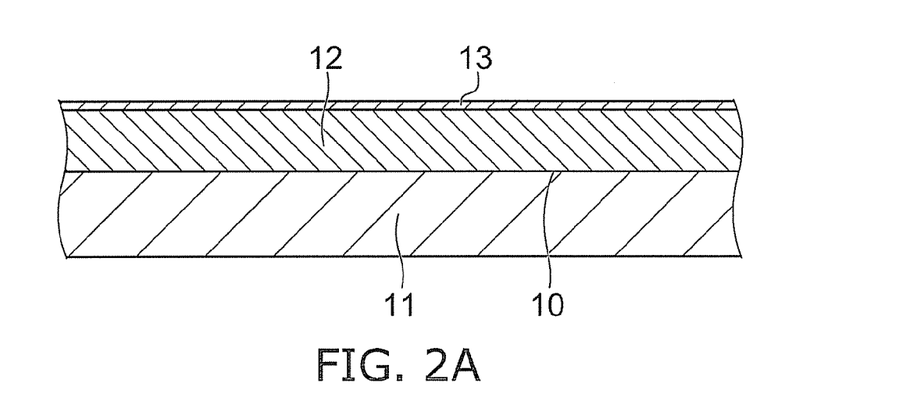
FIGS. 2A, 2B, 2C, 3A, 3B, 3C, 4A and 4B are schematic cross-sectional views showing a method for manufacturing the semiconductor light-emitting device according to the embodiment depicted in FIGS. 1A and 1B.

First, as shown in FIG. 2A, a first semiconductor layer 12 is formed on the major surface of a substrate 11, and a second semiconductor layer 13 is formed thereon. The surface of the first semiconductor layer 12 in contact with the major surface of the substrate 11 serves as the top surface 10. For instance, in the case where the light-emitting layer is made of a nitride semiconductor, the first semiconductor layer 12 and the second semiconductor layer 13 can be crystal grown on a sapphire substrate.

Figure 2B:
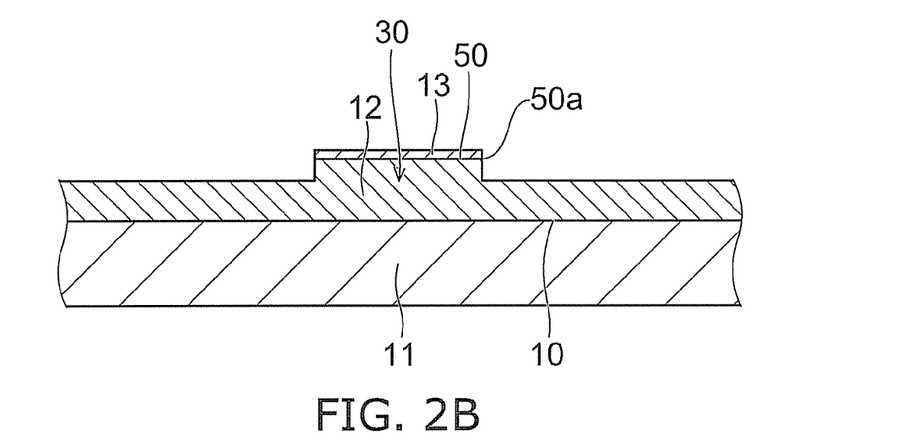

Next, illustratively by etching using a mask, not shown, the second major surface side of the first semiconductor layer 12 and the second semiconductor layer 13 is selectively removed. As shown in FIG. 2B, part of the first semiconductor layer 12 is processed into a protruding shape, and the second semiconductor layer 13 is selectively left on the surface of that protrusion 30. On the second major surface side other than the protrusion 30, the first semiconductor layer 12 is exposed.

The rest of the portion left as the protrusion 30 is etched deeper than the interface 50 between the second semiconductor layer 13 and the first semiconductor layer 12. Thus, the edge of the light-emitting layer 63 provided near the interface 50 can be reliably exposed and covered with a metal film 20 via an insulating film 14 in a later process.

Figure 2C:
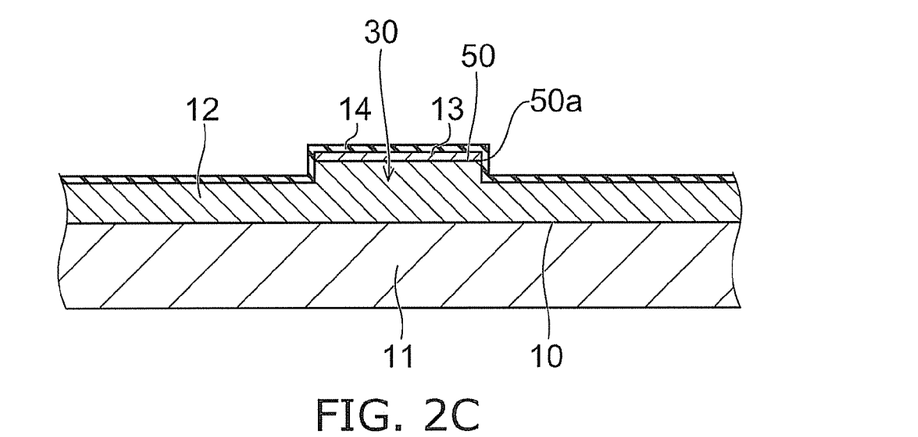

Next, as shown in FIG. 2C, an insulating film 14 entirely covering the first semiconductor layer 12 and the second semiconductor layer 13 is formed. The insulating film 14 covers the side surface of the protrusion 30 including the edge of the light-emitting layer 63. The insulating film 14 is illustratively a silicon oxide film, which is superior to resin in insulation performance.

Figure 3A:
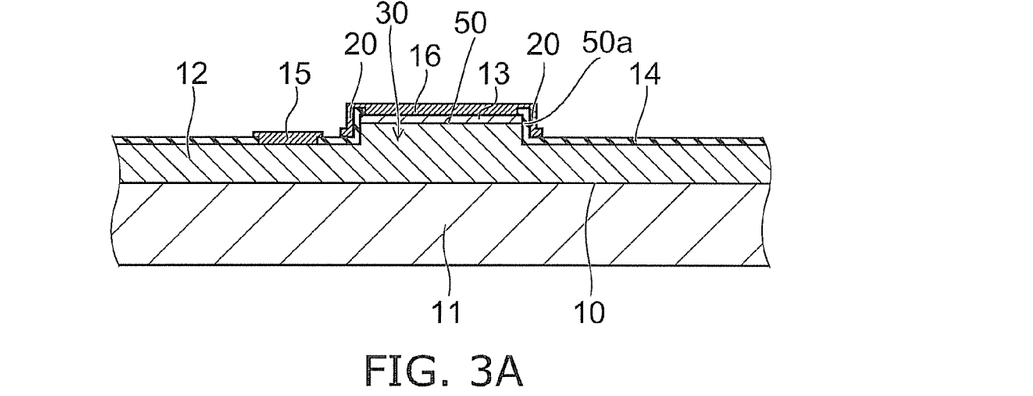

Next, as shown in FIG. 3A, openings are selectively formed in the insulating film 14. Then, an n-side electrode 15 is formed on the first semiconductor layer 12 exposed from the opening. Likewise, a p-side electrode 16 is formed on the second semiconductor layer 13 exposed from the opening of the insulating film 14.

Here, a metal film 20 covering the insulating film 14 formed on the side surface of the protrusion 30 can also be formed simultaneously with the formation of the p-side electrode 16 to suppress increase in the number of processes. In addition, the metal film 20 may be formed integrally with the n-side electrode 15 simultaneously with the formation of the n-side electrode 15. In this case, the metal film 20 is insulatively isolated from the p-side electrode 16 and the second semiconductor layer 13. Alternatively, the metal film 20 may have the structure of being insulatively isolated from both the n-side electrode 15 and the p-side electrode 16.

The n-side electrode 15, the p-side electrode 16, and the metal film 20 can be formed illustratively by evaporation. They can be made of such a material as Ni, Ag, Ti, Pt, and Au. Alternatively, more than one of these metals may be laminated to form the n-side electrode 15, the p-side electrode 16, and the metal film 20.

Figure 3B:
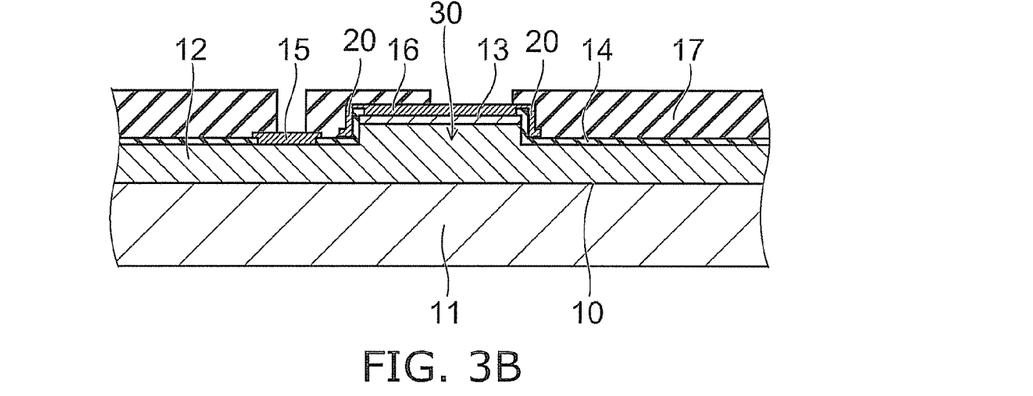

Next, an insulating layer 17 covering the n-side electrode 15, the p-side electrode 16, the metal film 20, and the insulating film 14 is formed. Then, as shown in FIG. 3B, an opening reaching the n-side electrode 15 and an opening reaching the p-side electrode 16 are formed in the insulating layer 17.

Next, a seed metal is formed on the upper surface and the inner wall of the opening of the insulating layer 17, and a plating resist, not shown, is further formed. Then, electrolytic plating is performed using the seed metal as a current path.

Figure 3C:
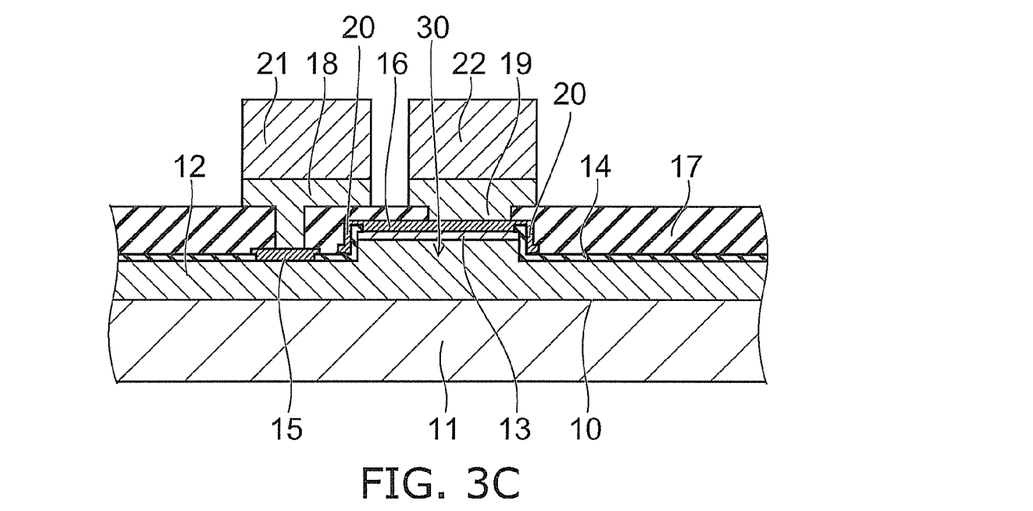

Thus, as shown in FIG. 3C, an n-side interconnect 18 connected to the n-side electrode 15 and a p-side interconnect 19 connected to the p-side electrode 16 are formed in the openings of the insulating layer 17 and on the insulating layer 17 therearound.

Next, the plating resist used in the plating for forming the n-side interconnect 18 and the p-side interconnect 19 is removed. Then, another plating resist for forming metal pillars is formed, and electrolytic plating is performed using the aforementioned seed metal as a current path. Thus, as shown in FIG. 3C, an n-side metal pillar 21 is formed on the n-side interconnect 18, and a p-side metal pillar 22 is formed on the p-side interconnect 19.

Subsequently, the plating resist is removed, and furthermore, the exposed portion of the seed metal is removed. This breaks the electrical connection between the n-side interconnect 18 and the p-side interconnect 19 through the seed metal.

Figure 4A:
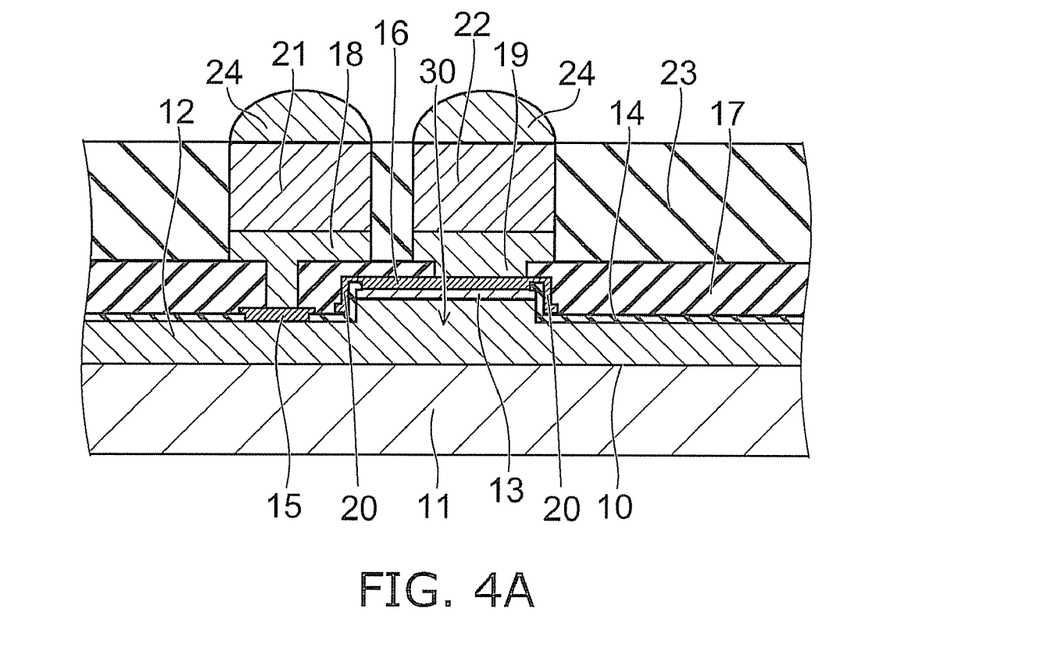

Next, as shown in FIG. 4A, the n-side interconnect 18, the p-side interconnect 19, the n-side metal pillar 21, the p-side metal pillar 22, and the insulating layer 17 are covered with a resin 23. Subsequently, the surface of the resin 23 is ground to expose the upper surface of the n-side metal pillar 21 and the p-side metal pillar 22. Then, external terminals 24 such as solder balls and metal bumps are provided on the exposed surface.

Figure 4B:
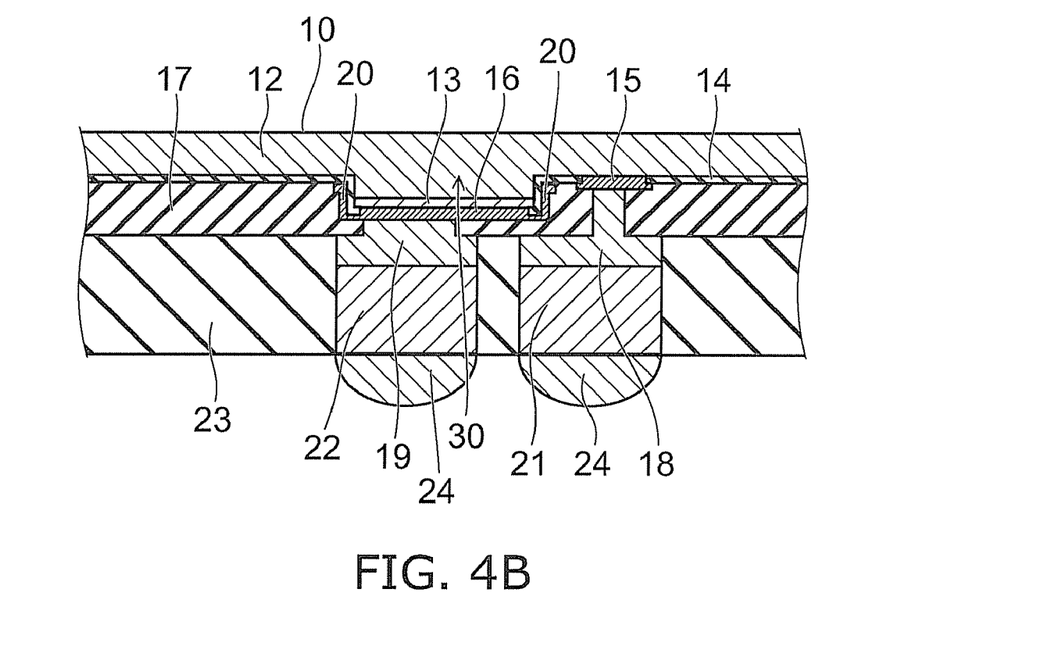

Next, as shown in FIG. 4B, the substrate 11 is removed. Here, FIG. 4B is depicted with the positional relationship turned upside down with respect to FIG. 4A.

The substrate 11 is removed from the first semiconductor layer 12 illustratively by laser lift-off. More specifically, laser light is applied toward the first semiconductor layer 12 from the rear surface side of the substrate 11, which is opposite to its major surface on which the first semiconductor layer 12 is formed. The laser light has a wavelength to which the substrate 11 is transmissive and which falls in an absorption region of the first semiconductor layer 12.

When the laser light reaches the interface between the substrate 11 and the first semiconductor layer 12, the first semiconductor layer 12 near the interface is decomposed by absorbing the energy of the laser light. For instance, in the case where the first semiconductor layer 12 is made of GaN, it is decomposed into Ga and nitrogen gas. Ga is left on the first semiconductor layer 12 side. This decomposition reaction forms a small gap between the substrate 11 and the first semiconductor layer 12, thereby separating the substrate 11 from the first semiconductor layer 12. Irradiation with the laser light is performed in multiple times on predefined regions across the wafer to strip the substrate 11.

After the substrate 11 is removed, a phosphor layer 40 is formed on the top surface 10 of the first semiconductor layer 12 as shown in FIG. 1A. For instance, the phosphor layer 40 is formed by applying a liquid resin mixed with phosphor particles by spin-coating, and then heat-curing it.

Because the phosphor layer 40 is formed after the substrate 11 is removed from above the top surface 10, the substrate 11 does not exist between the top surface 10 and the phosphor layer 40, which serves to increase the light extraction efficiency.

Subsequently, by dicing, a singulated semiconductor light-emitting device is obtained as shown in FIG. 1A. The methods for dicing can illustratively be machine cutting using a diamond blade or the like, laser irradiation, or high-pressure water. Here, because the substrate 11 has already been removed, dicing can be easily performed, and the productivity can be improved.

The aforementioned processes up to dicing are each performed collectively in wafer state, which enables production at low cost. Furthermore, the package structure including the interconnect layer, the resin 23, and the metal pillars 21 and 22 is formed in wafer level. This facilitates downsizing in which the overall planar size of the semiconductor light-emitting device is close to the planar size of the bare chip (first semiconductor layer 12 and second semiconductor layer 13).

Figure 5:
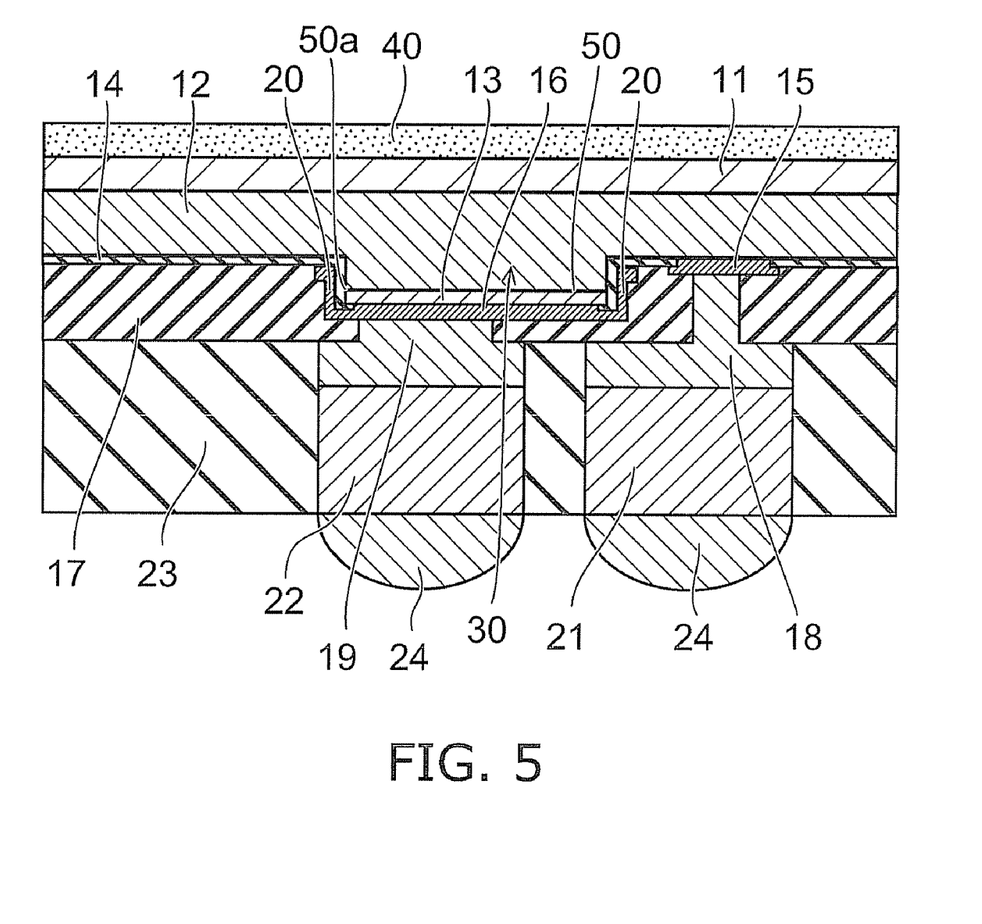
FIG. 5 is a schematic cross-sectional view of a semiconductor light-emitting device according to another embodiment.

In addition, the substrate 11 may not completely be removed, but ground thinly and left on the top surface 10 as shown in FIG. 5. By thinning and leaving the substrate 11, it is possible to achieve higher mechanical strength, and hence a more reliable structure than the structure in which the substrate 11 is completely removed. Furthermore, the remaining substrate 11 can suppress warpage after singulation, which facilitates mounting on a circuit board and the like.

Examples of the phosphor include red phosphor, yellow phosphor, green phosphor, and blue phosphor.

For instance, the red phosphor can include nitride phosphor, CaAlSiN$_3$:Eu, and sialon phosphor.

It is preferable to use the red sialon phosphor indicated by the following composition formula (1).

$$(M_{1-X}, R_X)_{a1}AlSi_{b1}O_{c1}N_{d1} \qquad (1)$$

M is at least one metal element except for Si and Al. Preferably, M is any of Ca and Sr at least. R is luminescence center atom. Preferably, R is Eu.

x, a1, b1, c1 and d1 satisfy the following relation.

0<x≦1, 0.6<a1<0.95, 2<b1<3.9, 0.25<c1<0.45, 4<d1<5.7

The red sialon phosphor indicated by the formula (1) improves temperature property of wavelength conversion efficiency. Furthermore, the red sialon phosphor much improves efficiency at large current density range.

For instance, the yellow phosphor can include silicate phosphor, and (Sr, Ca, Ba)$_2$SiO$_4$:Eu.

For instance, the green phosphor can include halogen phosphate phosphor, (Ba, Ca, Mg)$_{10}$(PO$_4$)$_6$.Cl$_2$:Eu, and sialon phosphor.

It is preferable to use the green sialon phosphor indicated by the following composition formula (2).

$$(M_{1-X}, R_X)_{a2}AlSi_{b2}O_{c2}N_{d2} \qquad (2)$$

M is at least one metal element except for Si and Al. Preferably, M is any of Ca and Sr at least. R is luminescence center atom. Preferably, R is Eu.

x, a2, b2, c2 and d2 satisfy the following relation.

0<x≦1, 0.93<a2<1.3, 4.0<b2<5.8, 0.6<c2<1, 6<d2<11

The green sialon phosphor indicated by the formula (2) improves temperature property of wavelength conversion efficiency. Furthermore, the green sialon phosphor much improves efficiency at large current density range.

For instance, the blue phosphor can include oxide phosphor, and BaMgAl$_{10}$O$_{17}$:Eu.

The embodiments of the invention have been described with reference to examples. However, the invention is not limited thereto, but can be variously modified within the spirit of the invention. The material, size, shape, layout and the like of the substrate, semiconductor layer, electrode, interconnect layer, metal pillar, insulating film, insulating layer, and resin can be variously modified by those skilled in the art, and such modifications are also encompassed within the scope of the invention as long as they do not depart from the spirit of the invention.

The invention claimed is:

1. A semiconductor light-emitting device comprising:
   a first semiconductor layer having a first major surface and a second major surface which is an opposite side to the first major surface;
   a second semiconductor layer provided on the second major surface of the first semiconductor layer and including a light-emitting layer;
   a first electrode provided on the second major surface of the first semiconductor layer;
   a second electrode provided on a second electrode side of the second semiconductor layer, the second electrode side being an opposite side to the first semiconductor layer;
   an insulating film provided on a side surface of the second semiconductor layer, and an edge of an interface between the first semiconductor layer and the second semiconductor layer; and
   a metal film provided on the insulating film extending from the second electrode side toward the edge of the interface.

2. The device of claim 1, wherein the metal film is provided laterally above the light-emitting layer.

3. The device of claim 1, wherein the insulating film continuously surrounds a periphery of the edge of the interface.

4. The device of claim 3, wherein the metal film continuously surrounds the periphery of the edge of the interface via the insulating film.

5. The device of claim 1, wherein
   a protrusion is provided in a part of a second major surface side of the first semiconductor layer and includes the interface between the first semiconductor layer and the second semiconductor layer, and
   the metal film covers a side surface of the protrusion via the insulating film.

6. The device of claim 1, wherein the metal film is provided integrally with the first electrode or the second electrode.

7. The device of claim 1, further comprising:
   a first metal pillar connected to the first electrode and provided on a second major surface side of the first semiconductor layer; and a second metal pillar connected to the second electrode and provided on the second major surface side of the first semiconductor layer.

8. The device of claim 7, further comprising:
a resin covering each periphery of the first metal pillar and the second metal pillar.

9. A semiconductor light-emitting device comprising:
a first semiconductor layer having a first major surface and a second major surface which is an opposite side to the first major surface;
a second semiconductor layer provided on the second major surface of the first semiconductor layer and including a light-emitting layer;
a first electrode provided on the second major surface of the first semiconductor layer;
a second electrode provided on a second electrode side of the second semiconductor layer, the second electrode side being an opposite side to the first semiconductor layer;
an insulating film provided on a side surface of the second semiconductor layer including an edge of the light-emitting layer; and
a metal film provided on the insulating film extending from the second electrode side toward the edge of the light-emitting layer.

10. The device of claim 9, wherein the insulating film continuously surrounds a periphery of the edge of the light-emitting layer.

11. The device of claim 10, wherein the metal film continuously surrounds the periphery of the edge of the light-emitting layer via the insulating film.

12. The device of claim 9, wherein
a protrusion is provided in a part of a second major surface side of the first semiconductor layer and includes the light-emitting layer, and
the metal film covers a side surface of the protrusion via the insulating film.

13. A method for manufacturing a semiconductor light-emitting device, comprising:
forming a multilayer body including a first semiconductor layer having a first major surface and a second major surface which is an opposite side to the first major surface, a second semiconductor layer including a light-emitting layer laminated on the second major surface of the first semiconductor layer, a first electrode formed on the second major surface of the first semiconductor layer and a second electrode provided on a second electrode side of the second semiconductor layer, the second electrode side being an opposite side to the first semiconductor layer;
forming an insulating film on a side surface of the second semiconductor layer, and an edge of an interface between the first semiconductor layer and the second semiconductor layer; and
forming a metal film on the insulating film extending from the second electrode side toward the edge of the interface.

14. The method of claim 13, wherein the metal film is formed simultaneously with the first electrode or the second electrode.

15. The method of claim 13, wherein the forming the multilayer body includes:
forming the first semiconductor layer on a substrate; and
forming the second semiconductor layer on the second major surface of the first semiconductor layer, the second major surface being an opposite side to the substrate.

16. The method of claim 15, further comprising:
selectively removing the second semiconductor layer and the second major surface side of the first semiconductor layer with the second semiconductor layer formed thereon to form, on the second major surface side, a protrusion including the interface between the first semiconductor layer and the second semiconductor layer after the forming the multilayer body.

17. The method of claim 16, wherein the forming the insulating film includes: forming the insulating film entirely on the second major surface so as to cover the protrusion.

18. The method of claim 17, further comprising: selectively forming opening portions in the insulating film on the second major surface and on an upper surface of the protrusion to expose a portion of the second major surface and a portion of the second semiconductor layer after the forming the insulating film,
wherein the first electrode and the second electrode are formed in the exposed portions.

19. The method of claim 16, wherein the metal film is formed on a side surface of the protrusion from identical material as the first and second electrodes when the first and second electrodes are formed.

20. The method of claim 15, further comprising:
separating the substrate from the first semiconductor layer by irradiating an interface between the substrate and the first semiconductor layer with laser light; and removing the substrate from the first semiconductor layer.

* * * * *